(12) United States Patent
Hatcher et al.

(10) Patent No.: US 10,832,774 B2
(45) Date of Patent: Nov. 10, 2020

(54) VARIATION RESISTANT 3T3R BINARY WEIGHT CELL WITH LOW OUTPUT CURRENT AND HIGH ON/OFF RATIO

(71) Applicant: Samsung Electronics Co., Ltd., Gyeonggi-do (KR)

(72) Inventors: Ryan M. Hatcher, Austin, TX (US); Titash Rakshit, Austin, TX (US); Jorge Kittl, Austin, TX (US); Rwik Sengupta, Austin, TX (US); Dharmendar Palle, Austin, TX (US); Joon Goo Hong, Austin, TX (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/448,820

(22) Filed: Jun. 21, 2019

(65) Prior Publication Data
US 2020/0279605 A1    Sep. 3, 2020

Related U.S. Application Data

(60) Provisional application No. 62/812,529, filed on Mar. 1, 2019, provisional application No. 62/812,826, filed on Mar. 1, 2019.

(51) Int. Cl.
| | | |
|---|---|---|
| *G11C 13/00* | (2006.01) | |
| *G11C 11/22* | (2006.01) | |
| *G11C 11/16* | (2006.01) | |

(52) U.S. Cl.
CPC ...... *G11C 13/0069* (2013.01); *G11C 11/1673* (2013.01); *G11C 11/1675* (2013.01); *G11C 11/223* (2013.01); *G11C 11/2273* (2013.01); *G11C 11/2275* (2013.01); *G11C 13/004* (2013.01); *G11C 2013/0045* (2013.01); *G11C 2013/0078* (2013.01)

(58) Field of Classification Search
CPC ............ G11C 13/0069; G11C 11/1673; G11C 11/1675; G11C 11/2273; G11C 11/223; G11C 13/004; G11C 11/2275; G11C 2013/0078; G11C 2013/0045
USPC .......................................................... 365/100
See application file for complete search history.

(56) References Cited

U.S. PATENT DOCUMENTS

| | | | | |
|---|---|---|---|---|
| 3,662,351 A | * | 5/1972 | Ho .......................... | G11C 7/20 365/95 |
| 9,378,812 B2 | | 6/2016 | Baker, Jr. | |

(Continued)

OTHER PUBLICATIONS

T. Yang et al., "A 28nm 32Kb embedded 2T2MTJ STT-MRAM macro with 1.3ns read-access time for fast and reliable read applications," 2018 IEEE International Solid—State Circuits Conference—(ISSCC), San Francisco, CA, 2018, pp. 482-484.

(Continued)

*Primary Examiner* — Fernando Hidalgo
(74) *Attorney, Agent, or Firm* — The Farrell Law Firm, P.C.

(57) ABSTRACT

A weight cell and device are herein disclosed. The weight cell includes a first field effect transistor (FET) and a first resistive memory element connected to a drain of the first FET, a second FET and a second resistive memory element connected to a drain of the second FET, the drain of the first FET is connected to a gate of the second FET and the drain of the second FET is connected to a gate of the first FET, and a third FET, and a load resistor connected to a drain of the third FET.

20 Claims, 5 Drawing Sheets

(56) References Cited

U.S. PATENT DOCUMENTS

| | | | |
|---|---|---|---|
| 9,466,363 B2 | 10/2016 | Endoh et al. | |
| 9,740,255 B2 * | 8/2017 | Ohsawa | G11C 14/0081 |
| 9,805,790 B2 | 10/2017 | August et al. | |
| 10,263,816 B2 * | 4/2019 | Welch | H04B 10/60 |
| 2017/0272258 A1 * | 9/2017 | Tanamoto | H04L 9/0866 |
| 2019/0332577 A1 * | 10/2019 | Yang | G06F 16/137 |

OTHER PUBLICATIONS

J. Ryu et al., "A Reliable 2T2MTJ Nonvolatile Static Gain Cell STT-MRAM With Self-Referencing Sensing Circuits for Embedded Memory Application," in IEEE Transactions on Magnetics, vol. 52, No. 4, pp. 1-10, Apr. 2016, Art No. 3400310.

\* cited by examiner

VARIATION RESISTANT 3T3R BINARY WEIGHT CELL WITH LOW OUTPUT CURRENT AND HIGH ON/OFF RATIO

PRIORITY

This application is based on and claims priority under 35 U.S.C. § 119(e) to a U.S. Provisional Patent Application Ser. Nos. 62/812,529 and 62/812,826 filed on Mar. 1, 2019 in the United States Patent and Trademark Office, the entire contents of which are incorporated herein by reference.

BACKGROUND

There is an increasing demand for hardware accelerators for machine learning (ML) applications. The computations that dominate many of these ML applications are matrix vector multiplications. It is possible to do matrix vector multiplication very efficiently in analog through a crossbar network. However, in order to represent the weight, a memory element must be introduced in each weight cell. Static random access memory (SRAM) is large and power inefficient. Nonvolatile memory options such as redundant random access memory (RRAM), FLASH or spin-torque transfer magnetic random access memory (STT-MRAM) often suffer from a subset of other challenges including low on/off ratios, high variation and non-compatible programming voltages.

SUMMARY

According to one embodiment, a weight cell is provided. The weight cell includes a first field effect transistor (FET) and a first resistive memory element connected to a drain of the first FET, a second FET and a second resistive memory element connected to a drain of the second FET, the drain of the first FET is connected to a gate of the second FET and the drain of the second FET is connected to a gate of the first FET, and a third FET, and a load resistor connected to a drain of the third FET.

According to one embodiment, a device is provided. The device includes an array of weight cells, each weight cell including a first field effect transistor (FET) and a first resistive memory element connected to a drain of the first FET, a second FET and a second resistive memory element connected to a drain of the second FET, the drain of the first FET is connected to a gate of the second FET and the drain of the second FET is connected to a gate of the first FET, and a third FET, and a load resistor connected to a drain of the third FET. The device includes a processor configured to perform inference with the array of weight cells by setting inputs for a row of weight cells from among the array of weight cells according to a logical value of a corresponding neuron and reading outputs of a column of weight cells from among the array of weight cells.

According to one embodiment, a device is provided. The device includes an array of weight cells, each weight cell including a first field effect transistor (FET) and a first resistive memory element connected to a drain of the first FET, a second FET and a second resistive memory element connected to a drain of the second FET, the drain of the first FET is connected to a gate of the second FET and the drain of the second FET is connected to a gate of the first FET, and a third FET, and a load resistor connected to a drain of the third FET. The processor is configured to write to the resistive memory elements according to a direction of a current supplied to the resistive memory elements.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
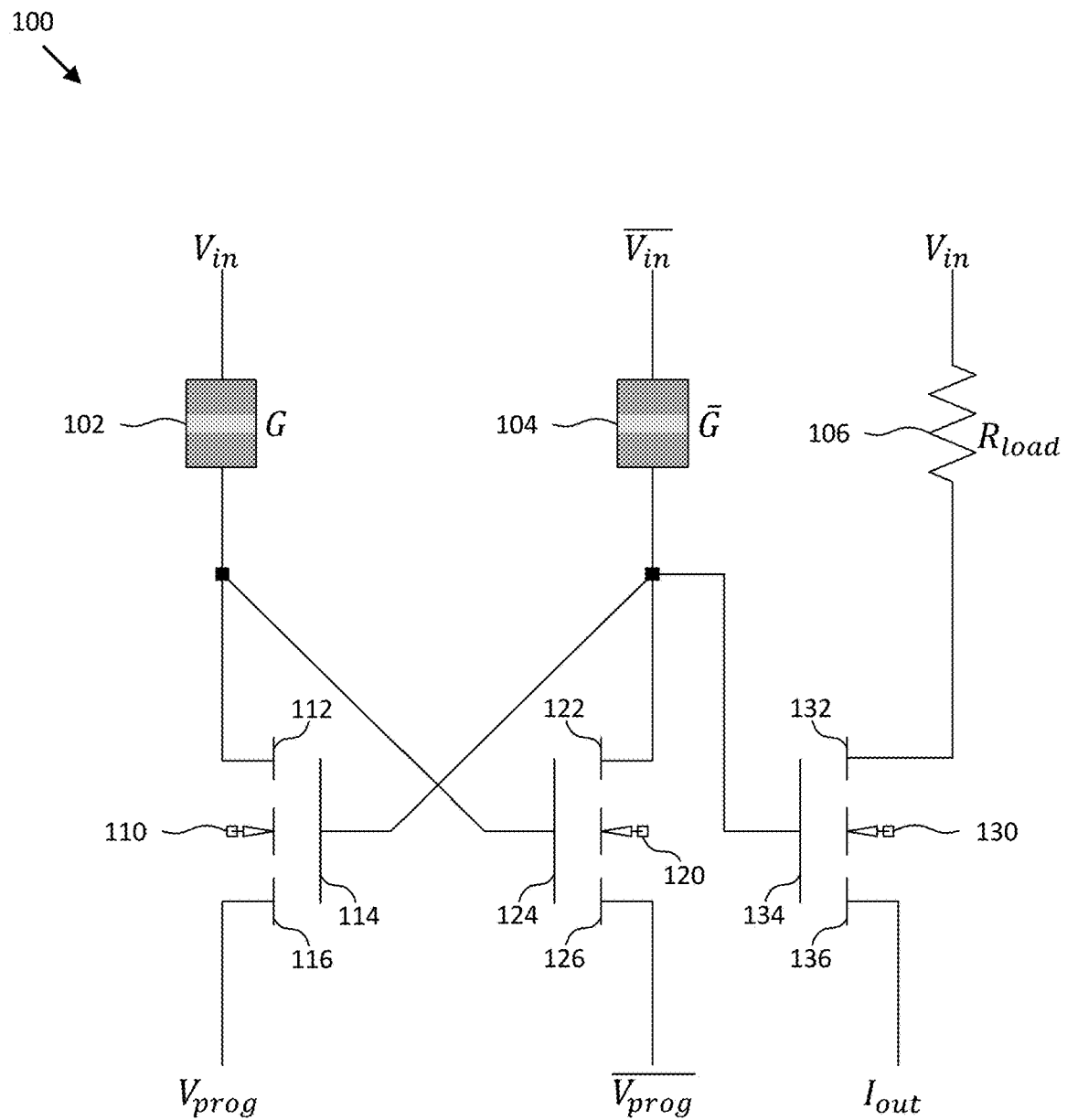
FIG. 1 is a diagram of a weight cell, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "$1^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The present disclosure provides a binary weight cell that efficiently enhances the on/off ratio of the resistive memory devices that may have relatively small intrinsic on/off ratios and reduces the magnitude and variation of the output current that is accumulated in parallel during inference.

In an exemplary case, a binary weight cell for semi-digital matrix vector multiplication includes two magneto tunnel junctions (MTJs), three N-type field effect transistors (NFETs) and a polysilicon load resistor. Each MTJ is a resistive memory element that can be in one of two states: a high resistive state or a low resistive state. Existing MTJ technology is only able to achieve a small high/low ratio of the conductance (typically only about 2~3). Moreover, the magnitude of the conductance of the MTJ is relatively large compared to what would be ideal for parallel reads during inference, leading to large output currents. The present disclosure provides a binary weight cell configuration with logical values {1,0} where the on/off ratio of the output current is closer to that of the transistor ($10^4$-$10^5$), even though the MTJ's have on/off ratios of only 2-3. Furthermore, the magnitude and variation of the output current for a logical 1 is limited by the load resistor, which can be engineered to match the desired output on current for large parallel reads, and have a lower variation than that of the MTJ.

FIG. 1 is a diagram of a weight cell 100, according to an embodiment. The weight cell 100 includes a first magneto tunnel junction (MTJ) 102, a second MTJ 104, and a load resistor 106. The weight cell 100 also includes a first field effect transistor (FET) 110, a second FET 120 and a third FET 130. The FETs 110, 120 and 130 are depicted as n-type FETs (NFET), although p-type FETs may be utilized. The FET 110 includes a drain 112, a gate 114, and a source 116. Likewise, the FET 120 includes a drain 122, a gate 124, and a source 126. The weight cell 100 includes a first cross coupling, such that the drain 112 of the FET 110 is connected to the gate 124 of the FET 120 and the drain 122 of the FET 120 is connected to the gate 114 of the FET 110. The FET 130 includes a drain 132, a gate 134, and a source 136. The load resistor 106 is connected to the drain 132 of the FET 130, and the gate 134 of the FET 130 is connected to the gate 114 of the FET 110.

The MTJ 102 has a conductance G while the MTJ 104 has a conductance $\overline{G}$. The weight cell 100 includes five independent external connections: the input $V_{in}$ to the MTJ 102 and the load resistor 106, the input $\overline{V_{in}}$ to the MTJ 104, the input $V_{prog}$ to the source 116 of the FET 110, the input $\overline{V_{prog}}$ to the source 126 of the FET 120, and an output $I_{out}$ connected to the source 136 of the FET 130. The MTJ 102 has a conductance G while the MTJ 104 has a conductance $\overline{G}$. Each MTJ 102 and 104 can be in one of two states, either a high conductance state $G_H$ or a low conductance state $G_L$. The cross coupling allows for a high on/off ration of the outputs. The MTJs 102 and 104 have different conductance states and the configuration determines the logical value. For example, if the weight cell 100 has a logical value of 1, then $G=G_L$ and $\overline{G}=G_H$. Likewise, if the weight cell 100 has a logical value of 0, then $G=G_H$ and $\overline{G}=G_L$, as shown in Table 1.

TABLE 1

| Logical Input | $V_{in}/\overline{V_{in}}$ | Logical Weight | G | $\overline{G}$ | $I_{out}$ |
|---|---|---|---|---|---|
| 0 | $V_r$ | Any | Any | Any | 0 |
| 1 | $V_r$ | 1 | $G_L$ | $G_L$ | $I_r$ |
| 1 | $V_r$ | 0 | $G_H$ | $G_L$ | 0 |

During inference, the weight cell 100 performs a multiplication operation in analog based on the potential on the input lines and the state of the weight cell 100. The product is an analog current on the $I_{out}$ output line. For an input with a logical value of 0, the input lines $V_{in}$ and $\overline{V_{in}}$ are both held at ground, which turns off the FETs 110, 120, and 130, and thus there is no current on the collective output line $I_{out}$. For an input with a logical value of 1, both input lines $V_{in}$ and $\overline{V_{in}}$ are held at the read voltage $V_r$, which should be small enough that the current across the MTJs is less than that which would result in a change of state (i.e., a read disturb fault). The cross coupling ensures that when $V_{in}=\overline{V_{in}}=V_r$, the transistor connected to the MTJ in the low conductance state will be turned on and the transistor connected to the MTJ in the high conductance state will be turned off. Therefore, if the gate 136 of the FET 130 connected to the load resistor 106 is connected to the gate 114 of the FET 110, then the FET 130 will be turned on whenever the FET 110 is turned on, and the FET 130 will be turned off whenever the FET 110 is turned off. The output current is then approximately equal to either 0 or a read current $I_r$, where $I_r = V_r/R_{load}$, in the limit of no leakage current and zero series resistance of the pass transistors, respectively. There is a parasitic static current $G_L V_r$ in each weight cell whenever the input is a logical 1 since either the FET 110 or the FET 120 is on.

Figure 2:
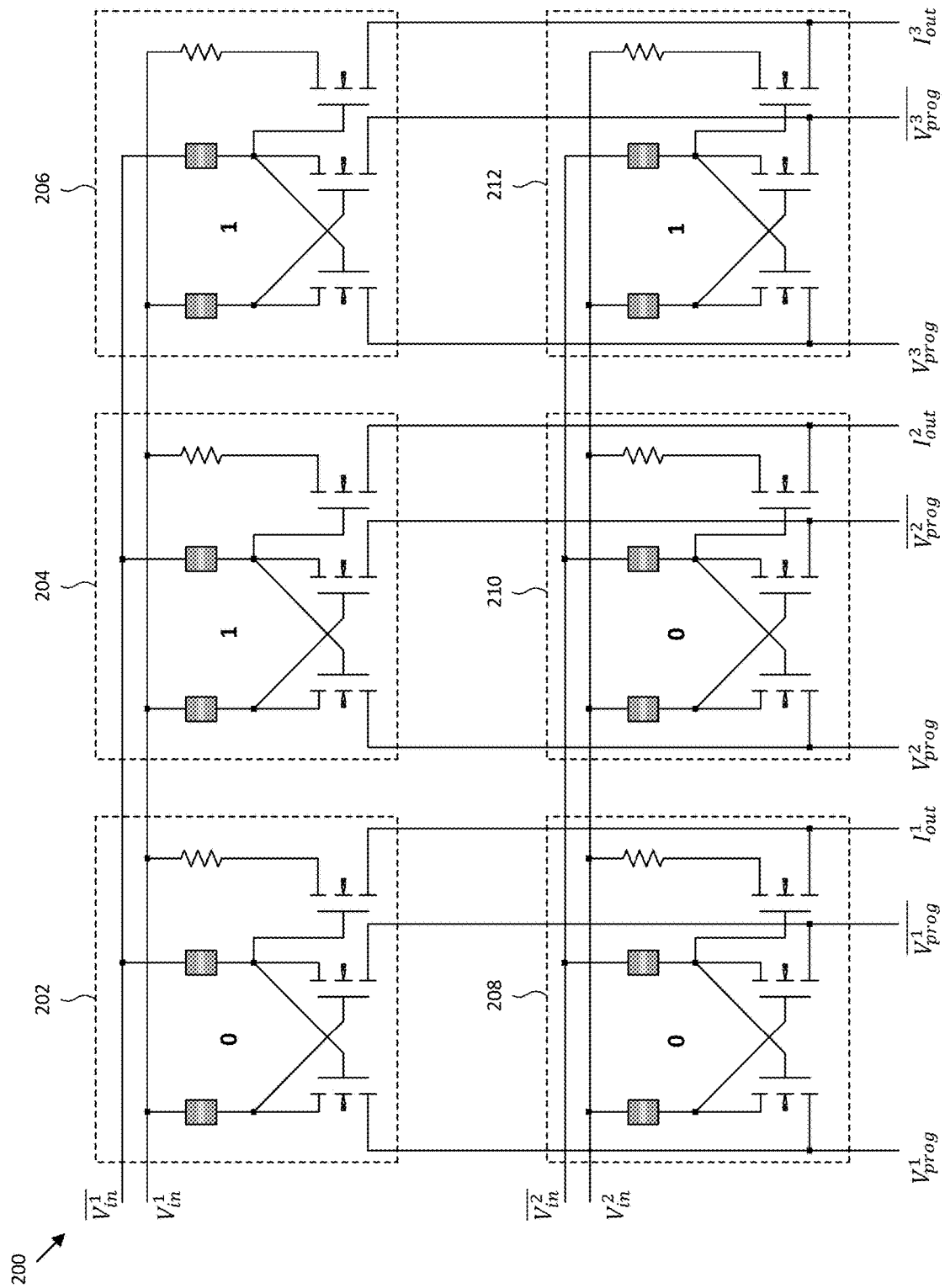
FIG. 2 is a diagram of a weight cell array, according to an embodiment.

FIG. 2 is a diagram of a weight cell array 200, according to an embodiment. The weight cell array 200 includes two rows of weight cells, with the first row including weight cells 202-206, and the second row including weight cells 208-212. To perform inference with the array 200, the inputs for each row are set according to the logical value of the corresponding neuron. The output lines $I_{out}^1$, $I_{out}^2$, and $I_{out}^3$ are read in parallel along each column and the total current on the $I_{out}$ output is measured and divided by $I_r$ to obtain the product of the binary multiplication between the N input neurons and the N binary weights in a given column. the inputs for each row are set according to the logical value corresponding to the neuron.

Figure 3A:
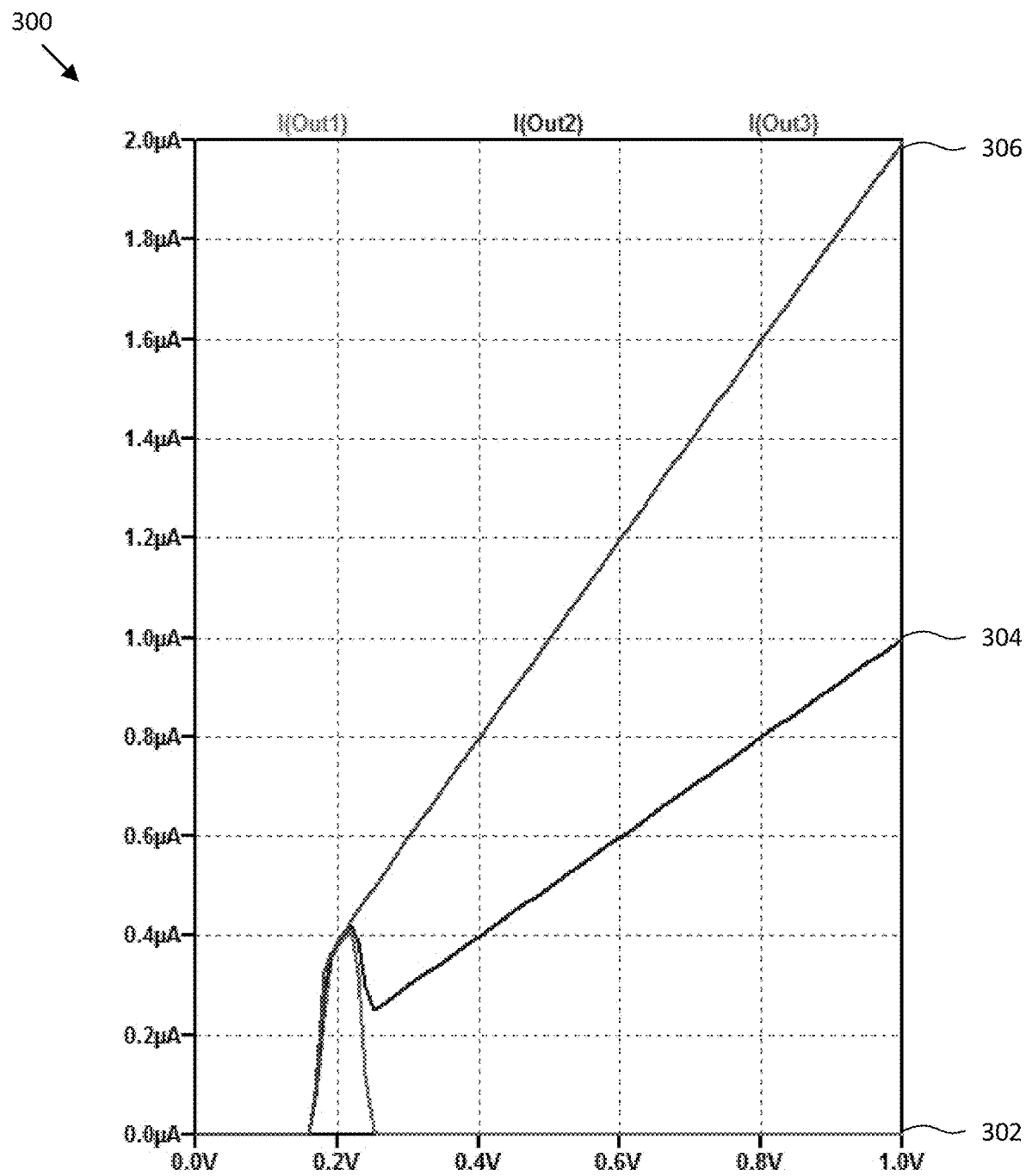
FIG. 3A is a graph of current output of a weight cell array with a linear axis, according to an embodiment.

FIG. 3A is a graph 300 of current output of a weight cell array 200 with a linear axis, according to an embodiment. Referring to the weight cell array 200, each weight cell has a logical value. Weight cell 202 has a logical value of 0, weight cell 204 has a logical value of 1, weight cell 206 has a logical value of 1, weight cell 208 has a logical value of 0, weight cell 210 has a logical value of 0, and weight cell 212 has a logical value of 1.

Referring to graph 300, the current read at the output of each column is different, representing different values for different pairs of logical values along each column. The output at $I_{out}^1$ is shown at line 302, the output at $I_{out}^2$ is shown at line 304, the output at $I_{out}^3$ is shown at line 306.

Figure 3B:
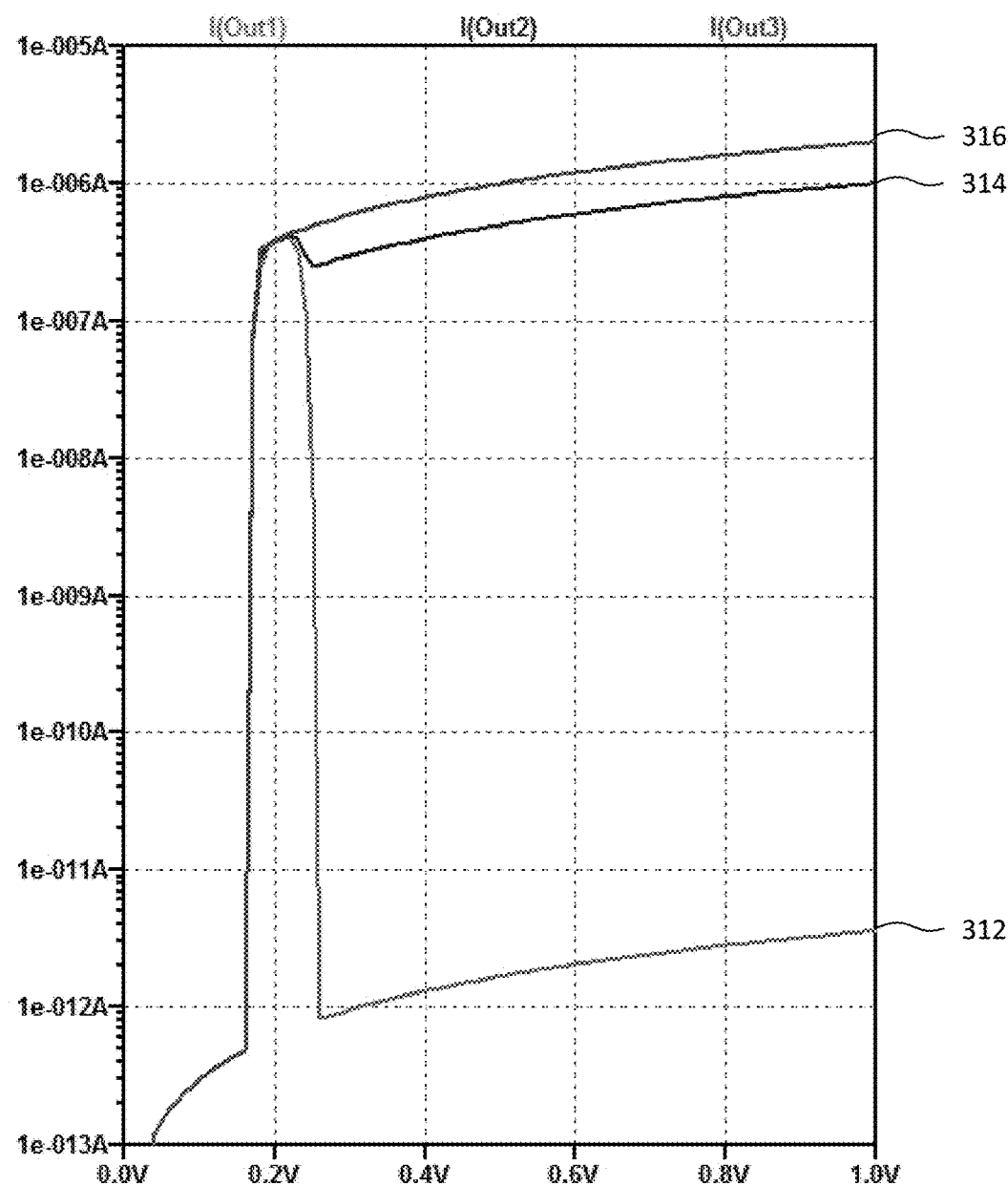
FIG. 3B is a graph of current output of a weight cell array with a semi-logarithm axis, according to an embodiment.

FIG. 3B is a graph 310 of current output of a weight cell array 200 with a semi-logarithm axis, according to an embodiment. Referring to graph 310, the current read at the output of each column is different, representing different values for different pairs of logical values along each column. The output at $I_{out}^1$ is shown at line 312, the output at $I_{out}^2$ is shown at line 314, the output at $I_{out}^3$ is shown at line 316.

Writing to a given cell requires separate steps depending on what direction the MTJ is being written ("down" or "up"), which is defined as the direction of the current with respect to the weight cell 100 shown in FIG. 1. Any MTJ can be written in either direction in one of three steps summarized in Table 2 and Table 3.

TABLE 2

| Write Op | Write Row | | All Other Rows | | | |
|---|---|---|---|---|---|---|
| | $V_{in}$ | $\overline{V_{in}}$ | $V_{in}$ | $\overline{V_{in}}$ | $V_{prog}$ | $\overline{V_{prog}}$ |
| G Down | $V_w$ | $V_w$ | 0 | 0 | 0 | $V_w$ |
| $\overline{G}$ Down | $V_w$ | $V_w$ | 0 | 0 | $V_w$ | 0 |

Table 2 is a summary of the write operation in the down direction, and voltages to write either MTJ down for all columns in a given row. $V_w$ is defined as the write voltage, which should be large enough to switch the MTJ. $I_{out}$ should be held at $V_w$ in order to eliminate the parasitic current across $R_{load}$ during writes. The G MTJ or the $\overline{G}$ MTJ can be programmed down for each cell in a given row at once by setting all the input lines to the voltages as shown in Table 2.

TABLE 3

| Write Op | Write Row | | All Other Rows | | | |
|---|---|---|---|---|---|---|
| | $V_{in}$ | $\overline{V_{in}}$ | $V_{in}$ | $\overline{V_{in}}$ | $V_{prog}$ | $\overline{V_{prog}}$ |
| G Down | $V_w$ | $V_w$ | 0 | 0 | 0 | $V_w$ |
| $\overline{G}$ Down | $V_w$ | $V_w$ | 0 | 0 | $V_w$ | 0 |

Table 3 is a summary of a write operation in the up direction, and the voltages to write either MTJ up for all rows in a given column. $I_{out}$ should be held at $V_w$ in order to eliminate the parasitic current across $R_{load}$ during writes. The G MTJ or the $\overline{G}$ MTJ can be programmed up for each cell in a given row at once by setting all the input lines to the voltages as shown in Table 3.

Other non-volatile memory technologies may be utilized in place of the STT-MRAM resistive memory element, such as pulse code modulation (PCM), Flash, ferroelectric random access memory (FeRAM), resistive random access memory (RRAM), etc. The transistors can be implemented alternatively with p-type field effect transistors. With PFETs, the polarities are all reversed for inference and writes.

Figure 4:
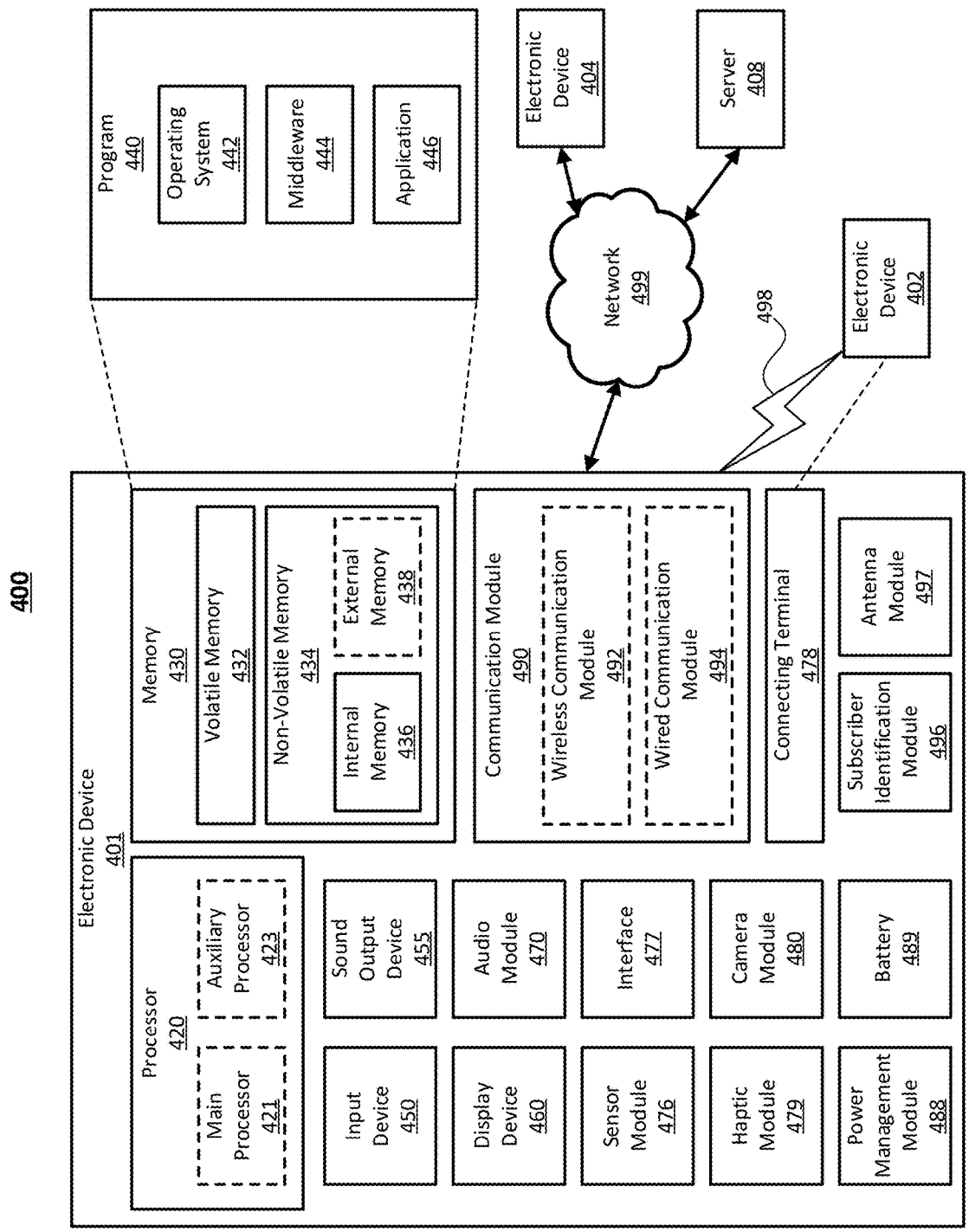
FIG. 4 is a block diagram of an electronic device in a network environment, according to one embodiment.

FIG. 4 is a block diagram of an electronic device 401 in a network environment 400, according to one embodiment. Referring to FIG. 4, the electronic device 401 in the network environment 400 may communicate with an electronic device 402 via a first network 498 (e.g., a short-range wireless communication network), or an electronic device 404 or a server 408 via a second network 499 (e.g., a long-range wireless communication network). The electronic device 401 may communicate with the electronic device 404 via the server 408. The electronic device 401 may include a processor 420, a memory 430, an input device 450, a sound output device 455, a display device 460, an audio module 470, a sensor module 476, an interface 477, a haptic module 479, a camera module 480, a power management module 488, a battery 489, a communication module 490, a subscriber identification module (SIM) 496, or an antenna module 497. At least one (e.g., the display device 460 or the camera module 480) of the components may be omitted from the electronic device 401, or one or more other components may be added to the electronic device 401. Some of the components may be implemented as a single integrated circuit (IC). For example, the sensor module 476 (e.g., a fingerprint sensor, an iris sensor, or an illuminance sensor) may be embedded in the display device 460 (e.g., a display).

The processor 420 may execute, for example, software (e.g., a program 440) to control at least one other component (e.g., a hardware or a software component) of the electronic device 401 coupled with the processor 420, and may perform various data processing or computations. As at least part of the data processing or computations, the processor 420 may load a command or data received from another component (e.g., the sensor module 476 or the communication module 490) in volatile memory 432, process the command or the data stored in the volatile memory 432, and store resulting data in non-volatile memory 434. The processor 420 may include a main processor 421 (e.g., a central processing unit (CPU) or an application processor (AP)), and an auxiliary processor 423 (e.g., a graphics processing unit (GPU), an image signal processor (ISP), a sensor hub processor, or a communication processor (CP)) that is operable independently from, or in conjunction with, the main processor 421. Additionally or alternatively, the auxiliary processor 423 may be adapted to consume less power than the main processor 421, or execute a particular function. The auxiliary processor 423 may be implemented as being separate from, or a part of, the main processor 421.

The auxiliary processor 423 may control at least some of the functions or states related to at least one component (e.g., the display device 460, the sensor module 476, or the communication module 490) among the components of the electronic device 401, instead of the main processor 421 while the main processor 421 is in an inactive (e.g., sleep) state, or together with the main processor 421 while the main processor 421 is in an active state (e.g., executing an application). The auxiliary processor 423 (e.g., an image signal processor or a communication processor) may be implemented as part of another component (e.g., the camera module 480 or the communication module 490) functionally related to the auxiliary processor 423.

The memory 430 may store various data used by at least one component (e.g., the processor 420 or the sensor module 476) of the electronic device 401. The various data may include, for example, software (e.g., the program 440) and input data or output data for a command related thereto. The memory 430 may include the volatile memory 432 or the non-volatile memory 434.

The program 440 may be stored in the memory 430 as software, and may include, for example, an operating system (OS) 442, middleware 444, or an application 446.

The input device 450 may receive a command or data to be used by other component (e.g., the processor 420) of the electronic device 401, from the outside (e.g., a user) of the electronic device 401. The input device 450 may include, for example, a microphone, a mouse, or a keyboard.

The sound output device 455 may output sound signals to the outside of the electronic device 401. The sound output device 455 may include, for example, a speaker or a receiver. The speaker may be used for general purposes, such as playing multimedia or recording, and the receiver may be used for receiving an incoming call. The receiver may be implemented as being separate from, or a part of, the speaker.

The display device 460 may visually provide information to the outside (e.g., a user) of the electronic device 401. The display device 460 may include, for example, a display, a hologram device, or a projector and control circuitry to control a corresponding one of the display, hologram device, and projector. The display device 460 may include touch circuitry adapted to detect a touch, or sensor circuitry (e.g., a pressure sensor) adapted to measure the intensity of force incurred by the touch.

The audio module 470 may convert a sound into an electrical signal and vice versa. The audio module 470 may obtain the sound via the input device 450, or output the sound via the sound output device 455 or a headphone of an external electronic device 402 directly (e.g., wired) or wirelessly coupled with the electronic device 401.

The sensor module 476 may detect an operational state (e.g., power or temperature) of the electronic device 401 or an environmental state (e.g., a state of a user) external to the electronic device 401, and then generate an electrical signal or data value corresponding to the detected state. The sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more specified protocols to be used for the electronic device 401 to be coupled with the external electronic device 402 directly (e.g., wired) or wirelessly. The interface 477 may include, for example, a high definition multimedia interface (HDMI), a universal serial bus (USB) interface, a secure digital (SD) card interface, or an audio interface.

A connecting terminal 478 may include a connector via which the electronic device 401 may be physically connected with the external electronic device 402. The connecting terminal 478 may include, for example, an HDMI connector, a USB connector, an SD card connector, or an audio connector (e.g., a headphone connector).

The haptic module 479 may convert an electrical signal into a mechanical stimulus (e.g., a vibration or a movement) or an electrical stimulus which may be recognized by a user via tactile sensation or kinesthetic sensation. The haptic module 479 may include, for example, a motor, a piezoelectric element, or an electrical stimulator.

The camera module 480 may capture a still image or moving images. The camera module 480 may include one or more lenses, image sensors, image signal processors, or flashes.

The power management module 488 may manage power supplied to the electronic device 401. The power management module 488 may be implemented as at least part of, for example, a power management integrated circuit (PMIC).

The battery 489 may supply power to at least one component of the electronic device 401. The battery 489 may include, for example, a primary cell which is not rechargeable, a secondary cell which is rechargeable, or a fuel cell.

The communication module 490 may support establishing a direct (e.g., wired) communication channel or a wireless communication channel between the electronic device 401 and the external electronic device (e.g., the electronic device 402, the electronic device 404, or the server 408) and performing communication via the established communication channel. The communication module 490 may include one or more communication processors that are operable independently from the processor 420 (e.g., the AP) and supports a direct (e.g., wired) communication or a wireless communication. The communication module 490 may include a wireless communication module 492 (e.g., a cellular communication module, a short-range wireless communication module, or a global navigation satellite system (GNSS) communication module) or a wired communication module 494 (e.g., a local area network (LAN) communication module or a power line communication (PLC) module). A corresponding one of these communication modules may communicate with the external electronic device via the first network 498 (e.g., a short-range communication network, such as Bluetooth™, wireless-fidelity (Wi-Fi) direct, or a standard of the Infrared Data Association (IrDA)) or the second network 499 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 492 may identify and authenticate the electronic device 401 in a communication network, such as the first network 498 or the second network 499, using subscriber information (e.g., international mobile subscriber identity (IMSI)) stored in the subscriber identification module 496.

The antenna module 497 may transmit or receive a signal or power to or from the outside (e.g., the external electronic device) of the electronic device 401. The antenna module 497 may include one or more antennas, and, therefrom, at least one antenna appropriate for a communication scheme used in the communication network, such as the first network 498 or the second network 499, may be selected, for example, by the communication module 490 (e.g., the wireless communication module 492). The signal or the power may then be transmitted or received between the communication module 490 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 401 and the external electronic device 404 via the server 408 coupled with the second network 499. Each of the electronic devices 402 and 404 may be a device of a same type as, or a different type, from the electronic device 401. All or some of operations to be executed at the electronic device 401 may be executed at one or more of the external electronic devices 402, 404, or 408. For example, if the electronic device 401 should perform a function or a service automatically, or in response to a request from a user or another device, the electronic device 401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 401. The electronic device 401 may provide the outcome, with or without further processing of the outcome, as at least part of a reply to the request. To that end, a cloud computing, distributed computing, or client-server computing technology may be used, for example.

One embodiment may be implemented as software (e.g., the program 440) including one or more instructions that are stored in a storage medium (e.g., internal memory 436 or external memory 438) that is readable by a machine (e.g., the electronic device 401). For example, a processor of the electronic device 401 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A weight cell, comprising:
   a first field effect transistor (FET) and a first resistive memory element connected to a drain of the first FET;
   a second FET and a second resistive memory element connected to a drain of the second FET, the drain of the first FET is connected to a gate of the second FET and the drain of the second FET is connected to a gate of the first FET,
   a third FET; and
   a load resistor connected to a drain of the third FET,
   wherein an input to a source of the first FET includes a first programming voltage and an input to a source of the second FET includes a second programming voltage opposite of the first programming voltage such that a current output from a source of the third FET indicates a logical weight of the weight cell.

2. The weight cell of claim 1, wherein the first FET, the second FET, and the third FET comprise n-type FETs.

3. The weight cell of claim 1, wherein the first FET, the second FET, and the third FET comprise p-type FETs.

4. The weight cell of claim 1, wherein the first resistive memory element and the second resistive memory element comprise magneto tunnel junctions (MTJs).

5. The weight cell of claim 1, wherein the first resistive memory element and the second resistive memory element comprise resistive random access memory (RRAM) elements.

6. The weight cell of claim 1, wherein the first resistive memory element and the second resistive memory element comprise ferroelectric random access memory (FeRAM) elements.

7. The weight cell of claim 1, wherein the first resistive memory element and the second resistive memory element comprise pulse code modulation (PCM) memory elements.

8. The weight cell of claim 1, wherein a gate of the third FET is connected to a gate of the first FET.

9. The weight cell of claim 1, further comprising a first external connection to a lead of the first resistive memory element and a second external connection to a lead of the second resistive memory element.

10. The weight cell of claim 9, wherein the first external connection provides a first input voltage to the first resistive memory element and the second external connection provides a second input voltage opposite of the first input voltage to the second resistive memory element.

11. The weight cell of claim 9, further comprising a third external connection to the source of the third FET configured to provide the current output from the source of the third FET.

12. The weight cell of claim 1, wherein the weight cell produces a logical value based on a conductance of the first resistive memory element and a conductance of the second resistive memory element.

13. A device, comprising:
an array of weight cells, each weight cell including:
a first field effect transistor (FET) and a first resistive memory element connected to a drain of the first FET;
a second FET and a second resistive memory element connected to a drain of the second FET, the drain of the first FET is connected to a gate of the second FET and the drain of the second FET is connected to a gate of the first FET,
a third FET; and
a load resistor connected to a drain of the third FET; and
a processor configured to perform inference with the array of weight cells by:
setting inputs for a row of weight cells from among the array of weight cells according to a logical value of a corresponding neuron; and
reading outputs of a column of weight cells from among the array of weight cells.

14. The device of claim 13, wherein the processor is further configured to perform inference by measuring a total current from the read outputs and dividing the total current by an output current.

15. The device of claim 13, wherein the first resistive memory element and the second resistive memory element comprise magneto tunnel junctions (MTJs).

16. The device of claim 13, wherein the first FET, the second FET, and the third FET comprise n-type FETs.

17. A device, comprising:
an array of weight cells, each weight cell including:
a first field effect transistor (FET) and a first resistive memory element connected to a drain of the first FET;
a second FET and a second resistive memory element connected to a drain of the second FET, the drain of the first FET is connected to a gate of the second FET and the drain of the second FET is connected to a gate of the first FET,
a third FET; and
a load resistor connected to a drain of the third FET;
wherein an input to a source of the first FET includes a first programming voltage and an input to a source of the second FET includes a second programming voltage opposite of the first programming voltage such that a current output from a source of the third FET indicates a logical weight of the weight cell; and
a processor configured to write to the resistive memory elements according to a direction of a current supplied to the resistive memory elements.

18. The device of claim 17, wherein the processor is configured to write to the resistive memory elements row by row of the array of weight cells when the direction of the current is down.

19. The device of claim 17, wherein the processor is configured to write to the resistive memory elements column by column of the array when the direction of the current is up.

20. The device of claim 17, wherein the first resistive memory element and the second resistive memory element comprise magneto tunnel junctions (MTJs).

* * * * *